United States Patent
Parapurath et al.

(10) Patent No.: US 8,983,820 B2
(45) Date of Patent: Mar. 17, 2015

(54) METHOD AND A SYSTEM FOR SIMULATION IN A SUBSTATION

(75) Inventors: Anoop A. Parapurath, Kannur (IN); Abhilash Gopalakrishnan, Bangalore (IN); Padmasri Krishnamurthy, Bangalore (IN); Narayanan Rajagopal, Bangalore (IN)

(73) Assignee: ABB Technology Ltd, Zurich (CH)

( * ) Notice: Subject to any disclaimer, the term of this patent is extended or adjusted under 35 U.S.C. 154(b) by 0 days.

(21) Appl. No.: 13/420,163

(22) Filed: Mar. 14, 2012

(65) Prior Publication Data
US 2012/0239373 A1  Sep. 20, 2012

Related U.S. Application Data

(63) Continuation of application No. PCT/IB2010/000582, filed on Mar. 19, 2010.

(30) Foreign Application Priority Data

Sep. 14, 2009  (IN) ............................ 2213/CHE/2009

(51) Int. Cl.
| | |
|---|---|
| G06G 7/54 | (2006.01) |
| G06F 17/50 | (2006.01) |
| H04L 12/26 | (2006.01) |
| G01R 31/327 | (2006.01) |

(52) U.S. Cl.
CPC .............. H04L 43/50 (2013.01); G01R 31/327 (2013.01); Y04S 40/168 (2013.01)
USPC .................... 703/18; 703/13; 703/21

(58) Field of Classification Search
CPC ............ G06F 17/5022; G06F 17/5036; G06F 17/5009; G06F 17/5018; G06F 11/261; G06F 2217/78; G06F 11/3457; G06B 9/00; H04L 41/145; H05K 999/99
USPC ................................................ 703/13, 18, 21
See application file for complete search history.

(56) References Cited

U.S. PATENT DOCUMENTS

| | | | |
|---|---|---|---|
| 2008/0103732 A1* | 5/2008 | Stoupis et al. ................ | 702/188 |
| 2008/0127210 A1 | 5/2008 | Bosold et al. | |
| 2009/0070062 A1 | 3/2009 | Kirrmann et al. | |

FOREIGN PATENT DOCUMENTS

| | | |
|---|---|---|
| EP | 1 850 142 A1 | 10/2007 |
| WO | WO 2007/079702 A1 | 7/2007 |
| WO | WO 2008/011618 A2 | 1/2008 |

OTHER PUBLICATIONS

Apostolov "IEC 61850 Distributed Analog Values Applications in Substation Automation Systems", hereafter A. IEEE 2005.*
International Search Report (PCT/ISA/210) issued on Aug. 13, 2010, by European Patent Office as the International Searching Authority for International Application No. PCT/IB2010/000582.

* cited by examiner

*Primary Examiner* — Saif Alhija
(74) *Attorney, Agent, or Firm* — Buchanan Ingersoll & Rooney PC

(57) ABSTRACT

A method and a system are disclosed for simulation in a substation. The method can include acquiring substation data from substation condition data and base substation record; adapting the acquired substation data to suit a target substation; and administering the adapted substation data on a communication channel of the target substation. The substation system can include a base substation which is an existing, a pre existing, or a target substation, or a substation defined by a user or any combination thereof; a substation automation system; test equipment configured to test the system and perform simulation in a target substation; and a human machine interface for interfacing the substation system with a user.

11 Claims, 3 Drawing Sheets

METHOD AND A SYSTEM FOR SIMULATION IN A SUBSTATION

This application claims priority as a continuation application under 35 U.S.C. §120 to PCT/IP2010/000582, which was filed as an International Application on Mar. 19, 2010 designating the U.S., and which claims priority to Indian Application 2213/CHE/2009 filed in India on Sep. 14, 2009. The entire contents of these applications are hereby incorporated by reference in their entireties.

FIELD

The present invention relates generally to the field of substation automation and, for example, to a method and a system for simulation in a substation.

BACKGROUND

Substations with high and medium voltage power networks can have primary equipments such as power transformers, instrument transformers, circuit breakers, switches, electrical cables, bus bars, incomers, feeders, etc which are arranged in switch yards and/or bays. These primary equipments are operated in an automated way by a Substation Automation (SA) system. The SA system includes computer servers, programmable devices called Intelligent Electronic Devices (IED), engineering and operator stations (clients), communication network connecting servers, IEDs and various clients on the network. The SA system is primarily responsible for monitoring, control and protection of substation equipments.

International Electrotechnical Committee (IEC) has introduced IEC 61850, now an internationally accepted communication standard for communication between the devices of the substation automation. The current SA systems are developed in conformance to such standards. The IEC 61850 advocates interoperability amongst Intelligent Electronic Devices (IEDs) from various manufacturers using common engineering models, data formats and communication protocol. The adaptation of IEC 61850 for the industrial SA system allows effective use of SA system tools for configuration and designing applications. The IEDs as referred herein are devices which are compliant to such IEC 61850 standard.

In practice, substation and SA system can be tested during commissioning, upgrading or maintenance of the substation or the SA system. Substation and SA system together are referred as "the System" in this discussion. The system is tested against power system conditions relating to the substation in order to address operation reliability and better predictability for a substation. In addition, there are other tests related to connectivity, operation and performance of the SA system carried out on the System.

It is recognized that the tests to simulate power system, power system condition or to test an aspect related to SA system in the System can be of enormous significance and are not trivial. In many cases, the testing is done using highly expensive and bulky test equipment resulting from the need to support analog connectivity to devices in the System or to support multiple devices configured using multiple propriety communication protocols. Often, such tests demand additional hardwiring to be carried out involving SA system devices and substation equipment, particularly in the System that is not completely IEC 61850 compliant.

In certain other cases, the tests are limited to operation of a limited number, such as one device in connection with specific substation equipment (e.g. an IED in connection with a circuit breaker). Such tests can be carried out using relatively simpler test equipment, especially if the device is a IEC 61850 compliant device. However, it is recognized that tests on a System having multiple devices and equipment, such as for a large substation, are complex. This is due to the effort to configure the test equipment and draw inferences. The effort is mainly expended towards configuring the test equipment: a) to recognize the substation configuration and to communicate with each and every device/equipment connected in the System; b) to execute the test plan reflecting operation of one or more individual devices/equipment and capture interactions among the various individual devices/equipment; and c) to test performance and adequacy of supporting devices, for example devices related to communication network (routers, network switches etc).

In the state of art, there is no test equipment that can comprehensively test the System, or provide tests that are simple to perform. The present disclosure describes methods and systems that can, for example, provide such capabilities.

SUMMARY

Accordingly the present disclosure provides a method for simulation in a substation. An exemplary method comprises: acquiring substation data from substation condition data and base substation record; adapting the acquired substation data to create adapted substation data which will suit a target substation; and administering the adapted substation data on a communication channel of the target substation.

The present disclosure also provides a substation system comprising: a base substation which is an existing substation, a pre existing substation, a target substation, a substation defined by a user, or any combination thereof; a substation automation system; test equipment configured to test the substation system and perform simulation in a target substation; and a human machine interface for interfacing the substation system with a user.

BRIEF DESCRIPTION OF THE DRAWINGS

Exemplary embodiments will be discussed in detail with reference to FIGS. 1 to 3 of the accompanying drawings, in which.

DETAILED DESCRIPTION

Figure 1:
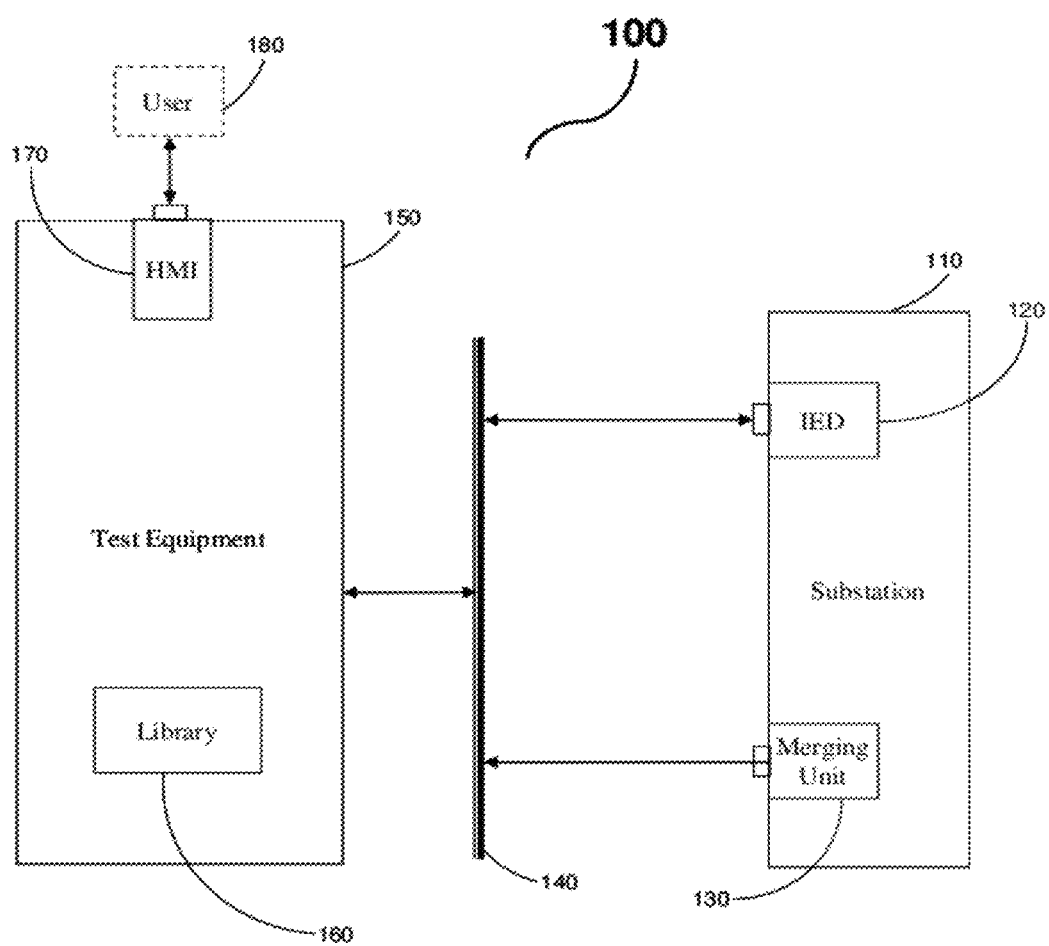
FIG. 1 shows a substation system according to an exemplary embodiment.

Exemplary embodiments will be explained for a System that is based on the IEC 61850 standard. The IEC 61850 is an open communication standard defining engineering models, data formats and communication protocol that devices in the System may use for development and operation of the System. The design and function of test equipment for simulation in the substation system can rely on features resulting from adaptation of IEC 61850 standard for the System.

An exemplary method and system are disclosed for easily performing simulation in a substation.

Such a method and a system can reuse past events and substation conditions for simulation in the substation.

The exemplary method and a system can address (e.g., ensure) reliability in operation and predictability of the substation.

The exemplary method and system can perform simulation in a substation device or in an entire system.

Further, the exemplary method and system are capable of performing on-site simulation in a substation.

Exemplary test equipment as disclosed herein can include a computer-based apparatus that has programmable features and executes test and simulation programs involving the System. For example, a Personal Computer, a laptop or a computer machine belonging to the System can be configured in addition to functioning as test equipment. The test equipment can be connected to an IEC 61850 based plant or process bus (communication channel) in the System.

To test or perform a simulation, the test equipment can receive data related to the substation layout along with various SA system devices. In addition, information related to functionality of various equipment/devices in the System, connectivity details, communication and network information of the devices and equipment of the System can be provided for comprehensively testing or simulation in the System. Most of these data will be part of a SA system and available as one or more configuration files. This data referred to as substation data are either acquirable directly from the SA system or adaptable from similar data related to any other System. The other System data is referred to as a base substation record in this disclosure.

Therefore the test equipment should have capability to acquire as much of information about the System under test from the SA system of the System and adapt data as desired to carry out simulation/test. The adaptation is also made from various base substation records available as a library with the test equipment. The base substation record can contain both substation information of a existing or pre-existing System (some other substation existing elsewhere in the present or that of the past) and also event/condition information that had occurred in the existing/pre-existing System. The event/condition related information may also be available as a separate information record (referred as a substation condition data). It is to be noted that the substation condition data is either available as a part of base substation record or as a separate data record as another library with the test equipment.

The substation event/condition data can include both normal event (example a merging unit publishing current and voltage sample values) and abnormal event (fault condition arising because of malfunction of the protection IED). As one would recognize, variety of normal and abnormal events associated with various devices/equipment in the System are possible. It is valuable to have functionalities in the test equipment to test through simulation of various events for a new System or in the System that has undergone any kind of change.

It is also to be recognized that an effective way to recreate useful and relevant events for simulation for a System is through reuse of as much as information as possible from the records (library). This can reduce the effort to configure the test equipment to perform simulation in the System. This also brings predictability in the System.

The IEC 61850 has well defined data formats that can be used to communicate data for monitoring, control and protection. An IEC 61850 compliant Merging Unit in a substation system provides sampled and digitized current and voltage data in the defined data format (IEC 61850-9-2). One would recognize that current and voltage information is basic information connected with a condition of a substation, in general any electrical network. Further, it is the voltage and current data that can trigger various events in the substation. Therefore, in this disclosure, as an exemplary illustration, merging unit data is being treated as primary data to create and trigger various events for test purposes in the substation under test. Henceforth, the substation under test (the substation where simulations are performed) is referred as target substation.

In FIG. 1, the System (100) is illustrated to include a test equipment (150) connected to a digital communication channel (140) that connects SA devices based on particular standards such IEC 61850. The sampled voltage and current data can be provided by Merging Units associated with the substation. However, to illustrate an exemplary embodiment, the Merging Unit (130) associated with the System (or the section of the System) is isolated and the test equipment (150) sends out the sampled voltage and current (simulated) in the communication channel (140) on the behalf of the Merging unit. The IED (120) would respond to the voltage and current data sent out by the test equipment (150) in the same manner as if the Merging Unit (130) indeed sent out the voltage and current data communication.

It is re-iterated that in the System that is IEC 61850 compliant it is adequate to send out digital information in the communication channel in order to simulate an event or condition in the System. Here, the term "condition" is used in generic sense to include both normal (operating) condition and abnormal (fault) condition. The term 'event' is used to indicate an event of interest. An event could include (e.g., consist of) one or more states of the System where the states change in a temporal manner having a well defined cause and effect. It is to be noted that the term 'condition' in general can include multiple events belonging to operating and fault conditions.

The test equipment (150) could easily take a role of one or more devices such as MU (130) and simulate a particular condition, either normal or abnormal condition in the System. It is to be noted that the particular condition can be enacted (simulation) in the System (100) with streams of data injected by the test equipment (150) into the System. The test equipment (150) in addition to injection of data is also capable of receiving all information that is sent out (published) in the communication channel (140) to assess response of a particular device or multiple devices including interactions between the multiple devices in the System. Further, the test equipment (150) is also capable of adapting (in programmed manner) based on published information in the communication channel (140). In other words, the test equipment (150) is capable of injecting data as a response to information received in the communication channel (140).

The data published in the communication channel can be based on the IEC 61850 data format containing multiple data frames that has both power system information and the communication network information. In addition to simulation related to power system condition, it is possible to design a simulation to test communication network. The conditions related to communication network simulation include both connectivity and performance related tests by creating suitable events and by having corresponding data generated in the System in command of the test equipment (150). The data in the communication channel being the sampled data can be correlated with some information such as quality, lost samples etc. These contribute to the quality attributes and are associated with the sampled data, which provides information to the subscribed devices like IEDs to check whether the corresponding data can perform its function. The test equipment when desired can be programmed to analyze the quality information as well. This feature of the test equipment allows comprehensive testing and simulation in the System.

As mentioned earlier, a condition is simulated through one or more events in the System. The events can include one or more of hardware equipment related events (configurations, functionality, performance), power system related events, network related events, communication related events (connectivity, protocols) etc. The events that are simulated could be one or more depending upon the importance, criticality, sufficiency, related effects etc. Examples of power system related events include states related to protection, monitoring or control functions in the substation. Examples of network related events include occurrence and capture of unsupported packets, undetected source sending data and corrupted packets in the communication channel.

The above paragraphs illustrate the general philosophy of an exemplary embodiment explained through the features and scope of the test equipment. An exemplary method to configure the test equipment to perform simulation in the System is hereby described.

The test equipment can be provided with a library (160) of stored substation data files. These files are specific to a particular substation and are used as base files to configure test equipment for simulation. The particular substation data therefore is referred to as base substation data and the condition data related to the particular substation is referred to more generically as substation condition data. The substation condition data herein referenced includes conditions, events and interactions related to a power system, substation devices and equipment, communication system, and networks in the substation. Further, the substation condition data is also derivable from one or more of the data like substation failure mode data, fault tree data, state diagrams, substation site acceptance test data, substation factory acceptance test data, specifically designed test cases for substation verification and validation. These events can be stored as XML files.

As mentioned earlier, the base substation data and substation data, made available as records in a library can be records created from existing or pre-existing substations. A new record may be freshly created or a record from existing or pre-existing substation may be suitably modified by an expert user with help of relevant engineering tools. As an example, an instance of creating such a library record is provided herewith. For instance, a problem in the merging unit or the communication channel can result in losing the sampled data. This could be treated as an event and captured and recorded along with its relevant information and corresponding substation data for use as a record in the library. Information on the position of the circuit breakers and isolators and the substation configuration can also be stored in the library.

The test equipment may be used as a device that captures events and conditions in the substation either automatically or user initiated to update its library. The records for library may come from any external source or a global repository. The test equipment in turn may constantly update the global repository if so configured. The user (180) can also include information on how the System behaved for a given fault or a problem and thereby provide an opinion on the same. These inputs can be also stored in the library (160).

Power system information can be inferred with respect to the single line diagram. The bay to which the devices in a substation are connected and the associated devices are identified for instance, from information corresponding to current and voltage channels represented as logical node information present in the substation configuration information. The substation configuration information from the target substation including the single line diagram information, device and equipment information, and communication network information can be gathered and used as reference to configure the test equipment.

Relevant data pertaining to the target substation for use in test and simulation is referred to as substation data. The substation data mentioned here can be one or more of power system data, communication data, network information, and data relating to substation, device, equipment/components and configuration. The power system data refers to data such as current, voltage, trip information, line diagram etc and can be stored as COMTRADE (COMmon format for TRAnsient Data Exchange) files. The communication data relate to data such as communication standard, protocols, data packet information, data frame information and can be stored as files in .ACP format, which is a format for network traffic capture. The network information referenced here can relate to information like MAC address, IP address, router information, data frame information etc.

The action of performing the check is referenced as Meta analyses and it can be done by comparing the substation data with tolerance benchmarks or reference standards or a combination thereof.

In line with the foregoing, exemplary embodiments can further be explained through non exhaustive exemplary cases. At the outset, testing of a System with relevance to its commissioning is one such case under consideration.

Owing to the above, commissioning of a System can involve various stages, in which testing is one of the prime stage. The System which is commissioned or to be commissioned is the target system. The testing here is introduced either to test the System on-site or to simulate events in a target System before actual commissioning is done. To perform this, simulation of one or more events can be performed for which the data as described herein before are involved. Though, the test system thrives on use of base substation records from the library, it should be noted that the data can also be obtained from the user which may form the entire part of the data or a part thereof which is taken in conjunction with the data made available as described herein. In an exemplary embodiment, a base substation record that approximately resembles the target substation schematics (line diagram) is selected from the library. Similarly, a substation condition data is also selected from the library based on the event that is desired for simulation. It is re-iterated here, that a base substation record may include the events as well wherein the base substation record selected is expected to approximately match the schematics of the target substation and also possess the desired event information.

Obtaining the substation condition data and the substation data from the library for simulation of events is referred to as the acquiring of data or data acquisition.

Figure 2:
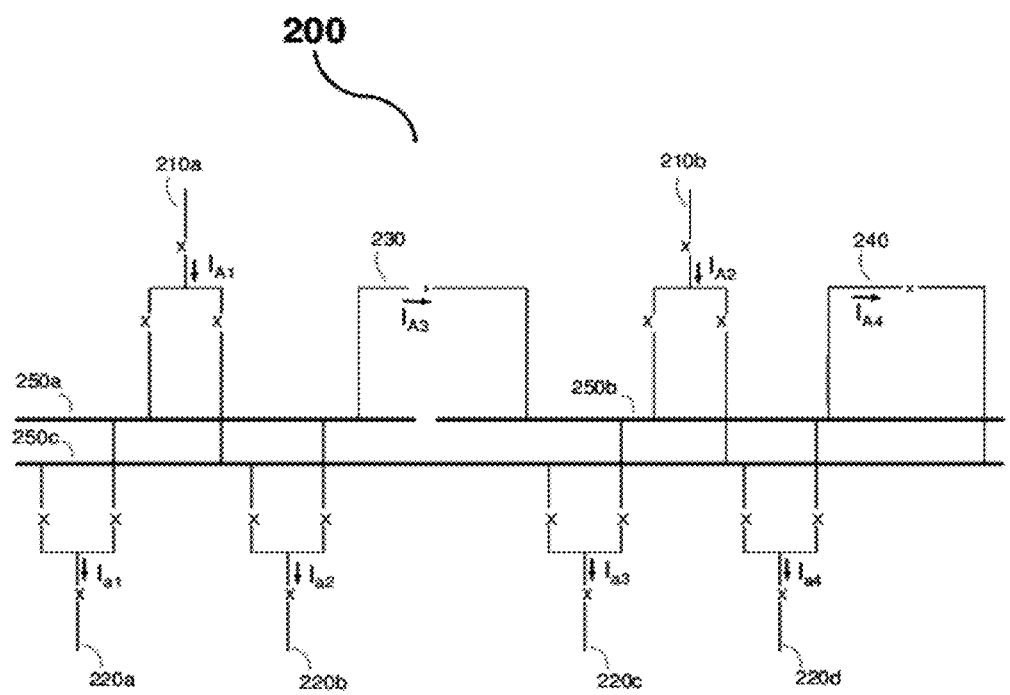
FIGS. 2 and 3 show aspects related to configuration considered as non exhaustive exemplary cases.
Figure 3:
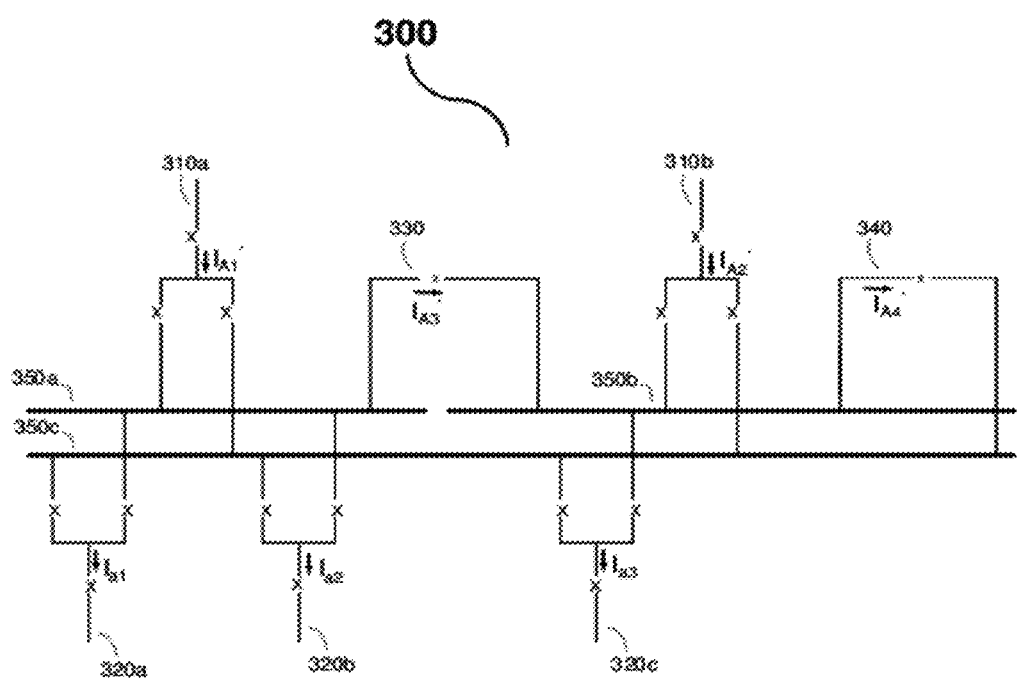

The data acquisition is followed by mapping the acquired data. Mapping can be done by comparing the base substation data with that of the target system. Considering a target substation schematic (300) as shown in FIG. 3 having three feeders (320a, 320b and 320c) as compared with the base substation schematic (200) as shown in FIG. 2, selected on a basis of close resemblance having four feeders (220a, 220b, 220c and 220d) as non exhaustive exemplary embodiment, an exemplary embodiment can be explained further. In accordance to the same, a target substation (300) of the target system as considered here has one feeder less compared to the base substation (200) and all other features in the schematics being identical. It is to be noted that the FIG. 2 and FIG. 3 embodiments are much simplified and most of the devices that normally are present in the substation are not depicted in the figures. However, one would recognize that Incomer, Feeders, Bus section and Bus coupler are addressed as Bays and the various devices connected to a particular bay along with information regarding merging unit can be easily retrieved from the logical node information in the configuration files.

By observing the substation data and the ratings corresponding to the base and target substation it can be decided which is the corresponding feeder in the target substation which can be treated as missing from the substation data made available from the base substation record. Feeder information such as rating, sampling frequency etc may also be used to identify the feeder that closely resembles the target system. The base station record is suitably changed to match the configuration of the target substation. Further, the base substation record is changed to correspond to the target substation data. This is referred to as a mapping step as all the device identities, network identities of the target substation are mapped into the base station record. At this stage, the base station record has all the configuration and identity information of the target substation along with the event of interest. This provides a data termed to be mapped substation data which is further used in the context of the embodiment. Though, the configuration and identity information are now mapped to suit the target substation, the voltage and current sampled values present in the substation condition data containing the event of interest should be modified to correspond with that suitable for the target substation. This is referred to as modification and is illustrated with help of FIG. 2 and FIG. 3. FIG. 2 depicts a line diagram for a substation from the base substation record and FIG. 3 depicts a line diagram of the target substation.

In line with the foregoing embodiment, and as shown in FIG. 2, the current value being the power system data of the substation data relates to the base substation (200). The first phase currents of the respective bays in the base substation having four bays are represented as IA1, IA2, IA3, IA4, Ia1, Ia2, Ia3 and Ia4. On comparison of the line diagram from the base substation record with the line diagram of the target substation, it is evident that the target substation has one less feeder. The incomers (210a, 210b), bus section (230), bus coupler (240), feeders (220a, 220b, 220c), bus (250a, 250b, 250c) of the base substation (200) are analogous to the incomers (310a, 310b), bus section (330), bus coupler (340), feeders (320a, 320b, 320c), bus (350a, 350b, 350c) of the target substation (300), respectively. The missing feeder in the target substation (300), is referred to as the fourth feeder (220d) of the base substation (200). Further, for this example, bus section (230) and bus coupler (240) are considered as a closed condition in the base substation (200) and the contribution of the current of fourth feeder (220d) is subtracted vectorially from the incomers (210a, 210b) equally or in factors as described below.

$$I_{A1}' = I_{A1} - a \cdot I_{a4}$$

$$I_{A2}' = I_{A2} - b \cdot I_{a4}$$

$$I_{A3}' = I_{A3} - a \cdot I_{a4}$$

(If feeder (220d) of the base substation (200) is connected to Bus (250b) or Bus (250c))

$$I_{A3}' = I_{A3} - b \cdot I_{a4}$$

(If feeder (220d) of the base substation (200) is connected to Bus (250a))

$$I_{A4}' = I_{A4} - b \cdot I_{a4}$$

(If feeder (220d) of the base substation is connected to Bus (250c) and the Incomer 1 (210a) and Incomer 2 (210b) of the base station (200) connected to Bus (250c and 250b respectively)

$$I_{A4}' = I_{A4} - I_{a4}$$

(If feeder (220d) of the base substation is connected to Bus (250c) and the Incomer 1 (210a) and Incomer 2 (210b) of the base station (200) connected to Bus (250a and 250b respectively)

$$I_{A4}' = I_{A4}$$

(If feeder (220d) of the base substation data is connected to Bus (250a))

where 'a' and 'b' are less than 1 and depend on the incomers contribution towards the missing feeder. If a=b, contributions are equally distributed among the incomers (210a, 210b). Information on the position of circuit breakers and switches in the base substation data also decides the factors 'a' and 'b'. If the data of the missing feeder (220d) is in an opened condition or corresponds to one which is connected to a dead bus in the base substation data, then the contribution of that feeder need not be considered. If the ratings of the bays in the base substation data are different from that of target substation (300) then, IA1, IA2, IA3, IA4, Ia1, Ia2, Ia3 can be multiplied by a factor. The factor as herein described is represented as 'X' which can be a ratio between the ratings of the bay in the target substation (300) to the rating of the mapped bay in the base substation (200).

The Factor 'X' can also be decided by the user (180). The user (180) can also map the data from the base substation to different feeders by modifying them with respect to sampling frequency and rating, and also adjusting the contribution through incomers, bus section and bus coupler breakers.

Modifying the mapped substation data to constitute modified substation data is done as described herein above so as to suit the target substation and also to incorporate the substation condition data. The modification of the mapped substation data can be done according to the position of the breakers and isolators in different bays and this can be extended to various positions of switches and configuration of the substation. The newly made data (modified substation data) may be stored in the library (160) as a new base substation record for future use.

A user can vary the direction of flow of current through the bus section and bus coupler depending on each others position as well as the feeder and incomer connection to the bus. This can be done in the graphical single line representation of the target substation. Accordingly, the distribution of current through the bus section and bus couple breaker also varies. The user can thereby verify the substation automation function of the target system for various positions of bus coupler breakers and isolators.

The above example is an illustration of a power system condition. However, it is to be noted that the base station records capture various conditions in the substation (e.g. network related condition) for simulation in the target system for studies with unsupported packets received, undetected source sending data and corrupted packets. As mentioned earlier, the base substation record can involve suitable mapping and modification for simulation use in the target substation. Network related or communication events would involve an appropriate change made with regard to destination MAC/IP addresses. The change may be carried out automatically through suitable algorithms to update MAC addresses (source and destination within the target substation) to make the data suitable for simulation in the target substation network. Automatic computation and modifications for power system data may also be performed.

The user (180) can select from the library (160), different types of fault conditions, which have occurred in a bay or only that substation data corresponding to the bay of the base substation or a combination of such bay data of the base substation with relevant information for mapping and can be used in mapping with the target substation and other bay data can be modified accordingly. This proves to be an effective way of reusing the already available data for performing the simulation.

The modified substation data is applied on the common communication channel (140) after converting the modified substation data to communication and network data. Further, the applied data serves to create normal or fault conditions for test in the target substation. The test equipment (150) is capable of administering the modified substation data (simulation) to study response of devices, interactions between various devices, and also performance of the substation devices including performance of communication network devices (accessories). This administering the modified data to perform the simulation of events in fullest context concerning the target system is an exemplary feature of the embodiment disclosed herein.

Administration of modified substation data in algorithmic manner can include sending out data on the communication channel (140) and also receiving data from the communication channel to algorithmically a) decide further administration (sending and receiving) of data, b) carry out verification/validation activities or c) draw conclusions.

As an example, administration for power system event simulation may include the test equipment (150) to check the time taken for the sample value packets from the server to target, where the time stamp information from the source is compared with the time stamp from the target by the test equipment as a part of simulation studies to estimate performance. As another example, the CRC errors that indicate cable errors or errors with network card are captured from the data in the communication channel and inferred. The data may be used to infer if the errors are due to local collision, remote collision or late collision. The test equipment may directly acquire the desired information from the communication channel or compute/estimate from the information acquired from the communication channel and use them for comparison with known/expected values/information (benchmark activity). Further examples for benchmark in network condition simulations are:

1) Local collision if found greater than 10% (benchmark value) are usually considered as an issue with network.
2) CRC errors greater than 2% (benchmark value) of traffic is considered excessive.

Examples from power system conditions for benchmark may include performance of one kind of device (e.g. one manufacturer against another manufacturer for IED devices), substation configurations (including network configuration) with applications for monitoring, control or protection or identification of exceptions from quality attributes for IEC 61850-9-2 sampled values (overflow, out-of-range etc).

In another non exhaustive exemplary case, simulation of events with relevance to refurbish or upgrading a system is considered. Accordingly, the acquisition of data as described herein can be obtained from the existing legacy substation. As explained earlier, inputs from the user may also be included in combination thereto. In a legacy substation, it is assumed that the merging unit is absent (e.g., the information (analog) from CT/VT are directly provided to the IEDs and a centralized disturbance recorder, if provided in the substation). The fault in any of the feeders then is assumed to be stored in the IED associated with the feeder where the fault has occurred. The centralized disturbance recorder stores all the Bay currents and voltages corresponding to that power system fault event. This stored disturbance data is acquired and made available as a base station record along with the substation configuration information. If the centralized disturbance recorder is not available, then the data from the IED associated with the feeder where the fault has occurred is acquired. This data can further be used to reconstruct the entire substation data.

In case of simulation during an upgrade activity from legacy substation system to an advanced substation system (with IEC 61850 compliant merging unit), the base substation record if created from the legacy system using the stored disturbance data is made use or any other relevant base substation record is used for simulation. The fault data here is mapped to the merging unit and used for simulation of the fault captured from a legacy system in the upgraded system. It is to be noted that such simulation of faults from legacy system are possible in a new or any different system.

In another embodiment, the test equipment is also provided with a power system simulation component to create a virtual substation and events through power system simulation in the virtual substation contribute to substation condition data. Simulations in non-critical cases, where performance related aspects are not the core aspect of study or where non-real time studies are acceptable; the simulation is for example carried out through appropriate administration with the data obtained from power system simulation component in the virtual substation executed in conjunction with simulation in target substation. For critical cases where performance related aspect is simulated the substation condition data from simulation in virtual substation may be pre-recorded and available as a base station record. It is to be noted that the data from the real substation (obtained from communication channel) may also be used as an input for simulation in the virtual substation. This feature can be useful to plan or design modification or up-gradation in a substation.

It should also be noted that the embodiments as herein described before are not exhaustive and various possible combinations can be construed accordingly. The foregoing description sets forth numerous specific details to convey a thorough understanding of embodiments of the present disclosure. However, it will be apparent to one skilled in the art that embodiments of the present disclosure may be practiced without these specific details. Some well-known features are not described in detail in order to avoid obscuring the present invention. Other variations and embodiments are possible in light of above teachings, and it is thus intended that the scope of the present disclosure not be limited by this detailed description.

As such, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

We claim:

1. A method for simulation in a target substation, the method comprising:
    acquiring, in memory, base substation data that includes substation condition data and substation configuration information of a base substation, the substation condition data including conditions, events, and device interactions of a base substation;
    adapting, in a processor, the acquired base substation data to create adapted substation data which will suit a target substation, wherein the acquired base substation data is modified based on the substation configuration information of the base substation and substation configuration information of the target substation to create the adapted substation data, which corresponds to the substation configuration information of the target substation;

converting, by the processor, the adapted substation data to network data corresponding to a communication channel of the target substation by modifying one or more network identities of the adapted substation data; and administering, by the processor, the adapted substation data on the communication channel of the target substation, wherein the adapted substation data is administered on the communication channel to generate one of a normal or fault condition for testing in the target substation.

2. The method as claimed in claim 1, wherein the acquiring base substation data comprises:

selecting the substation condition data, at least one base substation record, or both from one or more stored or retrieval computer files from one of existing or pre-existing or target substations, from a tool supported at least partially by a user, or from any combination thereof.

3. The method as claimed in claim 1, wherein the adapting of the acquired base substation data comprises:

mapping the substation configuration information of the base station to the substation configuration information of the target substation; and modifying the substation condition data of the base station data based on the mapping, to correspond to the substation configuration information of the target substation.

4. The method as claimed in claim 3, wherein the mapping comprises:

mapping one or more device identities and network identities of the base station with one or more device identities and network identities of the target substation.

5. The method as claimed in claim 1, wherein the administering of the adapted substation data comprises:

comparing the adapted substation data in the communication channel with a benchmark value or reference standards or both; and validating the adapted substation data in the communication channel for target substation performance and functions.

6. A substation system comprising:

a target substation including having a plurality of devices connected over a network;

test equipment connected to the network of the target substation, the test equipment configured to:

acquire base substation data that includes substation condition data and substation configuration information of a base substation, the substation condition data including conditions, events, and device interactions of a base substation;

adapt the acquired base substation data to create adapted substation data which will suit a target substation, wherein the acquired base substation data is modified based on the substation configuration information of the base substation and substation configuration information of the target substation to create the adapted substation data, which corresponds to the substation configuration information of the target substation;

convert the adapted substation data to network data corresponding to a communication channel of the target substation by modifying one or more network identities of the adapted substation data; and administer the adapted substation data on the communication channel of the target substation, wherein the adapted substation data is administered on the communication channel to generate one of a normal or fault condition for testing in the target substation; and a human machine interface for interfacing the substation system with a user.

7. The system as claimed in claim 6, wherein the test equipment comprises:

a library for storing substation data which includes substation condition data, base substation record, mapped substation data, and/or modified substation data, the test equipment being configured for performing one or more of the following:

capturing substation data from a communication channel or recreating substation data from an IED or centralized disturbance recorder, and storing the substation data;

testing at least one device's functionality, performance and interaction with the plurality of devices in the substation system;

performing simulation of a substation condition in the substation system; and performing simulation of a substation condition in the substation system with simulation data from a virtual substation.

8. The system as claimed in claim 7, wherein the communication channel is a common communication channel based on an IEC 61850 communication standard.

9. The method of claim 1, further comprising:

receiving one or more responses from one or more devices of the plurality of devices of the target substation upon administering the adapted substation data on the communication channel of the target substation;

determining one or more interactions between the plurality of devices based on the one or more responses; and analyzing the one or more responses and the plurality of interactions based on the generated one of a normal or fault condition.

10. The method of claim 9, further comprising:

comparing the one or more responses with benchmark data to determine performance of the one or more devices in the target substation.

11. The method of claim 1, further comprising:

acquiring disturbance data associated with a fault condition and creating a base substation.

* * * * *